(12) United States Patent
Seki et al.

(10) Patent No.: US 7,329,944 B2
(45) Date of Patent: Feb. 12, 2008

(54) LEADFRAME FOR SEMICONDUCTOR DEVICE

(75) Inventors: Kazumitsu Seki, Nagano (JP); Harunobu Sato, Nagano (JP); Muneaki Kure, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/386,920

(22) Filed: Mar. 22, 2006

(65) Prior Publication Data
US 2006/0214272 A1 Sep. 28, 2006

(30) Foreign Application Priority Data
Mar. 25, 2005 (JP) ............................. 2005-088191

(51) Int. Cl.
*H01L 23/495* (2006.01)
(52) U.S. Cl. ............... 257/666; 257/677; 257/E23.041; 257/E23.053; 257/E23.054; 438/123
(58) Field of Classification Search ................ 257/666, 257/677, E23.041, E23.042, E23.053, E23.054; 438/123
See application file for complete search history.

(56) References Cited
U.S. PATENT DOCUMENTS
5,384,204 A * 1/1995 Yumoto et al. ............. 428/626

6,150,711 A * 11/2000 Kom et al. ................. 257/677

FOREIGN PATENT DOCUMENTS

| JP | 04-115558 | 4/1992 |
|----|-----------|--------|
| JP | 04-337657 | 11/1992 |
| JP | 11-111909 | 4/1999 |
| JP | 2001-110971 | 4/2001 |

* cited by examiner

*Primary Examiner*—Long K. Tran
(74) *Attorney, Agent, or Firm*—Rankin, Hill, Porter & Clark LLP

(57) ABSTRACT

A leadframe for a semiconductor device of the present invention is a leadframe for a semiconductor device having a stage section where a semiconductor chip is to be mounted, an inner lead section connected to the stage section, and an outer lead section connected to the inner lead section. The leadframe has (1) a nickel (Ni) layer 1, (2) a palladium (Pd) or palladium alloy layer 2, (3) a tin (Sn) or tin alloy layer or a zinc (Zn) or zinc alloy layer 3, 3a, or 3b, and (4) a gold (Au) layer 4, 4a, or 4b, all of which are formed on a base material B forming the leadframe in sequence from the surface of the leadframe.

15 Claims, 5 Drawing Sheets

LEADFRAME FOR SEMICONDUCTOR DEVICE

BACKGROUND OF THE INVENTION

1. Field of the Invention

The present invention relates to a leadframe used for a semiconductor device and, more particularly, to a leadframe for a semiconductor device which shows improved adhesion with sealing resin as well as improved solder wettability.

2. Description of the Related Art

A leadframe for a semiconductor device is used for mounting a semiconductor device, which is fabricated by sealing a semiconductor chip with resin material so as to be integrated with the leadframe, on a substrate or the like. In general, the leadframe has a stage section where a semiconductor chip is mounted; an inner lead section which is connected to the stage section and electrically connected to electrodes of the semiconductor chip through wire bonding; and an outer lead section, or the like, which is connected to the inner lead section and acts as an external connection terminal when the semiconductor device is mounted on the substrate, or the like. Such a leadframe is required for adhesion with a resin material used for sealing the chip. Also required is a superior bondability of an outer lead which is used for bonding the leadframe to a substrate so that a semiconductor device is mounted thereon by means of soldering or the like.

FIG. 6 is a plan view showing an example leadframe for a semiconductor device. In a leadframe 10, reference numeral 12 designates outer leads; 14 designates inner leads; 16 designates a stage section forming a chip mount section where a semiconductor chip (not shown) is mounted and which is connected to rails 20, 20 by means of a support bar 18. Reference numeral 22 designates a dam bar.

The semiconductor chip (not shown) is mounted on the stage section 16 of the leadframe 10. This semiconductor chip and the inner leads 14 are bonded by means of wires. The semiconductor chip, the wires, and the inner leads 14, all of which are situated within an area encircled by a broken line shown in FIG. 6, are sealed with resin, to thus complete a semiconductor device. In order to mount the semiconductor device on a substrate, or the like, soldering is usually utilized. In recent years, a leadframe, where a coating film has been formed over the outer leads 12 in advance (also called "exterior solder coating film"), is frequently utilized.

A leadframe enabling mounting a semiconductor device on a substrate without involvement of an exterior solder coating film had been known, which is comprised of a substrate for use with a leadframe, generally being called as a Pd-PPF (Palladium Pre-Plated Leadframe), a nickel (Ni) plating layer of a ground layer, an intermediate layer of a palladium (Pd) or Pd alloy coating film, and a surface layer of gold (Au) plating film or silver (Ag) coating film, those being sequentially formed on the substrate as disclosed in JP-A Hei 4-115558.

A leadframe, which is disclosed in JP-A Hei 4-337657 as another related-art example of a leadframe for a semiconductor device having a leadframe substrate being coated with exterior plating of material other than solder, is comprised of: an Ni-based plating layer provided on a base material of the leadframe; a Pd or Pd alloy plating layer provided on at least inner lead sections and outer lead sections on the base material; and an Au plating layer provided on the Pd or Pd alloy plating layer. Further, JP-A Hei 11-111909 also discloses a leadframe coated with substantially similar plating. Still Further, JP-A 2001-110971 discloses a leadframe having a Ni-based protective coating layer provided on a base material of the leadframe, an intermediate layer of Pd or Pd alloy plating, and an outermost layer formed by plating the intermediate layer with Pd and Au one after another.

Meanwhile, in recent years, a lead (Pb)-free soldering material has come into general use as a soldering material used for mounting a semiconductor device on a substrate, or the like, in view of environmental protection. Tin-zinc (Sn—Zn)-based solder, tin-silver-copper (Sn—Ag—Cu)-based solder, or the like, has been put into practical use as such a lead-free soldering material.

A related-art leadframe (a so-called Au/Pd/Ni leadframe) is formed by sequentially forming, on a base material for a leadframe, an Ni plating layer, a Pd or Pd alloy plating layer, and an Au plating layer. A semiconductor chip is mounted on the leadframe and sealed with a resin material, to thus produce a semiconductor device. When the semiconductor device is mounted through use of lead-free solder in place of conventionally-widely-used tin-lead solder, the fusing point of the employed lead-free solder is higher than that of the related-art tin-lead solder. For this reason, a reflow temperature must be increased. For instance, the fusing point of Sn—Ag—Cu solder, which has recently come to be used, is 217° C., and a temperature of about 240° to 250° is used for reflowing of the solder.

When the reflow temperature has increased, sealing resin is easily exfoliated from the leadframe because of a difference in coefficient of thermal expansion between a metallic material of the leadframe base material and the sealing resin. Because of contribution of hygroscopicity of epoxy-based resin, which is commonly used as sealing resin, moisture easily intrudes into cracks caused by exfoliation. The moisture is vaporized in subsequent thermal treatment, or the like, which in turn becomes a cause of serious defects, such as cracks in the sealing resin, fractures of the semiconductor chip, or the like.

SUMMARY OF THE INVENTION

It is an object of this invention to provide a leadframe for a semiconductor device for preventing the defects caused to the semiconductor device, specifically that of being caused by a difference in coefficient of thermal expansion between a leadframe base material and sealing resin.

A leadframe for a semiconductor device of the present invention is a leadframe for a semiconductor device having a stage section where a semiconductor chip is to be mounted, an inner lead section connected to the stage section, and an outer lead section connected to the inner lead section, the leadframe including: (1) a nickel (Ni) layer; (2) a palladium (Pd) or palladium alloy layer; (3) a tin (Sn) or tin alloy layer or a zinc (Zn) or zinc alloy layer; and (4) a gold (Au) layer, all of which are formed on a base material forming the leadframe, in sequence from the surface of the leadframe.

Preferably, the thickness of (2) the Pd or Pd alloy layer ranges from 0.005 to 0.05 μm; the thickness of (3) the Sn or Sn alloy layer or the Zn or Zn alloy layer ranges from 0.001 to 0.05 μm; and the thickness of (4) the Au layer ranges from 0.001 to 0.1 μm.

A combination of (3) the Sn or Sn alloy layer or the Zn or Zn alloy layer and (4) the Au layer, being formed over (2) the Pd or Pd alloy layer, might be also repeated twice or more time. When only a single combination of the two layers is used, the preferred thickness of the layer (3) and the preferred thickness of the layer (4) correspond to the thickness of the layer (3) and that of the layer (4). Meanwhile, when a plurality of combinations of the two layers are used, the total thickness of the layers (3) preferably falls within a range of 0.001 to 0.05 µm, and the total thickness of the layers (4) preferably falls within a range of 0.001 to 0.1 µm.

The layers (1) to (4) may be formed over the entire surface of the base material forming the leadframe, or the layers (1) to (4) may be formed over a portion of the base material forming the leadframe. In the latter case, the layers (1) to (4) are formed in at least the outer lead section.

The present invention can provide a leadframe for a semiconductor device which shows improved adhesion to sealing resin, without impairing solder wettability and spreadability required to mount a semiconductor device on a substrate or the like.

DESCRIPTION OF THE PREFERRED EMBODIMENTS

Figure 1A:
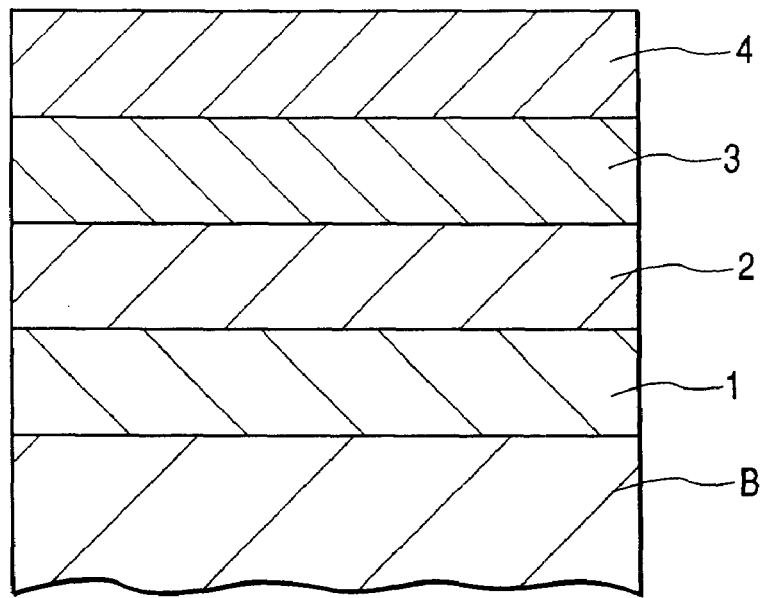
FIGS. 1A and 1B shows a cross-sectional view for describing the layered structure of a leadframe for a semiconductor device of the present invention.

As shown in a cross-sectional view of FIG. 1A, which describes a typical layered structure of a leadframe for a semiconductor device of the present invention, an Ni layer 1, a Pd or Pd alloy layer 2, an Sn or Sn alloy layer (or a Zn or Zn alloy layer) 3, and an Au layer 4 are formed on a base material B, in this sequence from the surface thereof, of the leadframe. The layered structure corresponds to a structure embodied by interposing an amphoteric metal layer, such as Sn, Sn alloy layer, Zn, or Zn alloy layer between a top layer of Au and the intermediate Pd layer of a related-art Pd-PPF (a so-called Au/Pd/Ni leadframe) As mentioned above, the base material B, the Ni layer 1, the Pd or Pd alloy layer 2, and the Au layer 4, which are included in the leadframe of the present invention, are basically analogous with those used in the related-art Pd-PPF.

Specifically, the base material B can be formed from a material used for an ordinary leadframe; e.g., Cu or a Cu alloy, an Fe—Ni alloy, or the like.

The Ni layer 1 located on the base material B can be formed to a thickness of 0.05 to 3 µm. At a thickness of less than 0.05 µm, solder wettability, which is required during mounting, is difficult to ensure, for reasons of diffusion of Cu. When the thickness exceeds 3 µm, cracks arise in plating during forming of outer leads, whereupon the base material becomes exposed.

The Pd or Pd alloy layer 2 on the Ni layer 1 can be formed to the range of thickness of 0.005 to 0.05 µm. At a thickness of less than 0.005 µm, solder wettability, which is required for mounting, is difficult to ensure, for reasons of diffusion of Ni. When the thickness exceeds 0.05 µm, Pd cannot be completely fused and diffused into solder during mounting operation, whereby wettability and spreadability are deteriorated.

The Au layer 4 of the outermost layer can be formed to a thickness of 0.001 to 0.1 µm. When the thickness is less than 0.001 µm, solder wettability, which is required during mounting, is difficult to ensure, because of diffusion of Sn and Zn. When the thickness exceeds 0.1 µm, Au forms an alloy layer with Sn during mounting operation, which in turn deteriorates adhesion strength.

The layer 3 interposed between the Pd or Pd alloy layer 2 and the Au layer 4 is formed from Sn or an Sn alloy or Zn or a Zn alloy. Here, the term "Sn alloy" signifies an alloy formed from Sn and another type of metal; and the term "Zn alloy" signifies an alloy formed from Zn and another type of metal. For instance, an alloy formed from Sn and Zn (a Sn—Zn alloy) is included in both categories, and the Sn—Zn alloy is a preferable as an Sn alloy or a Zn alloy used in the present invention.

The thickness of the Sn or Sn alloy (or Zn or Zn alloy) layer 3 preferably ranges from 0.001 to 0.05 µm. A thickness of less than 0.001 µm is insufficient for preventing a drop in adhesion, which would be caused by a difference in coefficient of thermal expansion between the leadframe and sealing resin. When the thickness exceeds 0.05 µm, an effect of enhancing defect prevention is saturated. Moreover, solder wettability and spreadability of solder reflow, which are required during mounting, are hindered. Preferably, the thickness of Sn or Sn alloy layer (or Zn or Zn alloy layer) 3 falls within a range of 0.005 to 0.05 µm.

The layers 1 to 4 can be formed by means of an arbitrary method for forming a thin film. For instance, a widely-known method, such as electroplating, electroless deposition, sputtering, or the like, can be utilized. Generally, electroplating is preferable.

In a preferred mode of a leadframe having a typical layered structure of the present invention shown in FIG. 1A, a Ni substrate layer of 0.5 µm in thickness is situated on a Cu alloy or Fe—Ni alloy base material, and an intermediate Pd layer having a thickness of 0.015 µm is provided on the Ni substrate layer. An Sn layer having a thickness of 0.01 µm is provided on the intermediate Pd layer, and an Au layer, which is the top layer and has a thickness of 0.007 µm, is provided on the Sn layer.

Figure 1B:
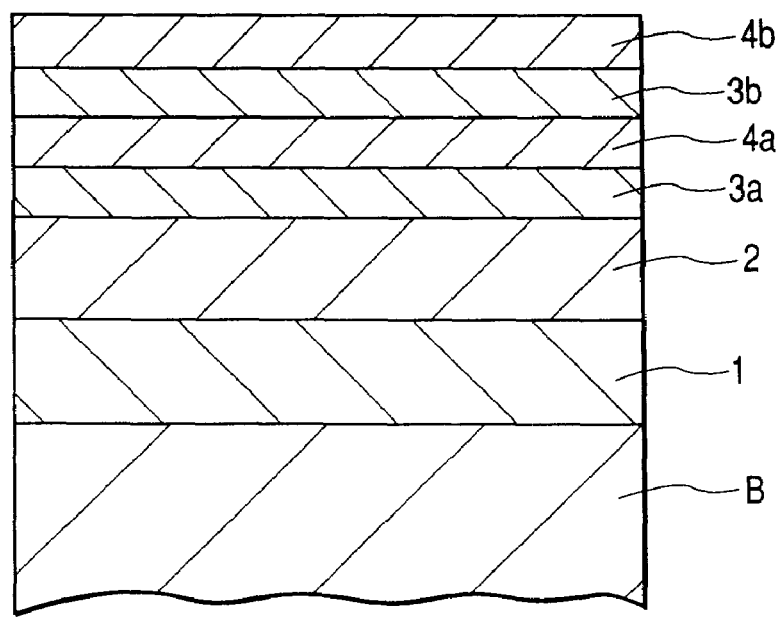

A combination of the Sn or an Sn alloy (or Zn or a Zn alloy) layer 3 with the Au layer 4 provided thereon may be single or plural. Put another way, a plurality of Sn or Sn alloy (or Zn or Zn alloy) layers and Au layers can be formed on the Pd or Pd alloy layer 2 one after another. FIG. 1B shows an example of leadframe having a plurality of Sn or Sn alloy (or Zn or Zn alloy) layers and Au layers. In the leadframe shown in FIG. 1B, the Sn or Sn alloy (or Zn or Zn alloy) layers 3a, 3b and the Au layers 4a, 4b, which are formed alternately, are situated on the Pd or Pd alloy layer 2. In the case of a mode where combinations of a plurality of sets, each of which consists of the Sn or Sn alloy (or the Zn or Zn alloy) layer and the Au layer provided thereon, are used, a total thickness of the Sn or Sn alloy (or the Zn or Zn alloy) layer preferably falls within a range of 0.001 to 0.05 µm.

The layers provided on the base material B (the layers 1 to 4 in the embodiment of FIG. 1A and the layers 1 to 4b in the embodiment of FIG. 1B) may be formed over the entire surface of the base material B or on portions of the same. In the latter case, the layers are formed in at least the outer lead section or the stage section.

Figure 2:
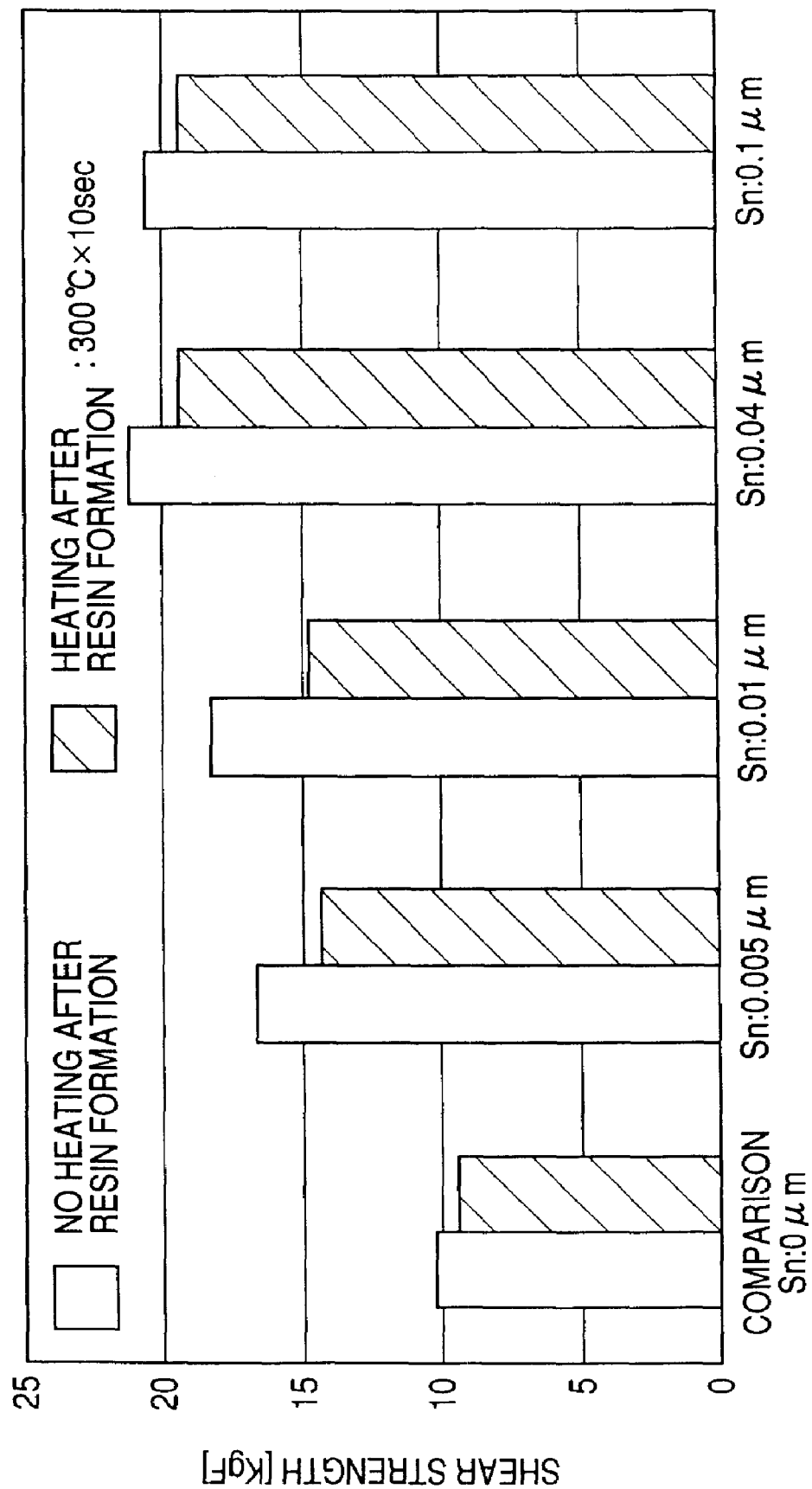
FIG. 2 is a graph showing results of a test for adhesion between a leadframe and a sealing resin.
Figure 3:
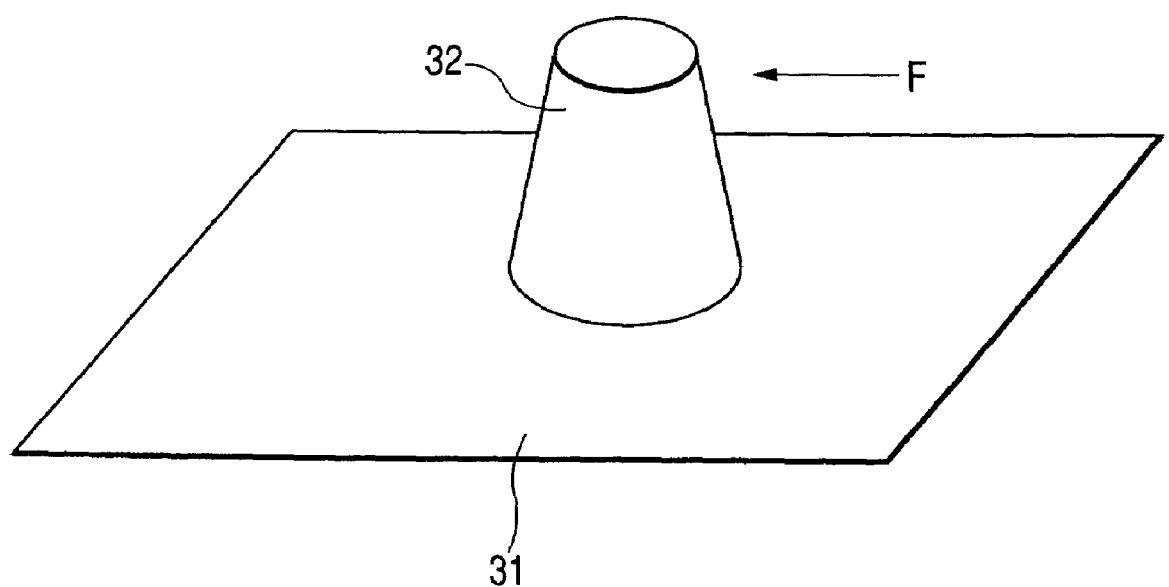
FIG. 3 is a perspective view for describing a sample used for the adhesion test.

FIG. 2 shows results of a test of adhesion between a leadframe and sealing resin. The adhesion test was conducted through use of a test leadframe sample prepared by sequentially forming, on a Cu base material, an Ni layer of 1 µm in thickness, Pd and Sn layers of 0.01 µm in thickness, and an Au layer of 0.007 μm by means of plating. The thickness of the Sn layer was changed within the range of 0.005 to 0.1 μm. CEL 9200 (manufactured by Hitachi Chemical Co., Ltd.) was used for sealing resin. The test leadframe was subjected to heat treatment for one hour at 175° C. (simulating conditions for curing a die-bonding adhesive used for mounting a chip on a leadframe) and another subsequent heat treatment for one minute at 240° C. (simulating heating conditions employed when wire-bonding is performed on a hot plate), as pre-treatment. As shown in FIG. 3, a truncated cone (a bottom surface having a diameter of 3.568 mm, an upper surface having a diameter of 3 mm, and a height of 3 mm) was formed from sealing resin 32 on a test leadframe 31 having undergone pre-treatment. Shearing force parallel to the surface of the leadframe was exerted on the truncated cone as indicated by arrow F, and shearing strength achieved when the leadframe 31 was exfoliated from the resin 32 was measured. Measurement was performed on a per-sample basis, after the truncated cone had been formed from resin and after the truncated cone had been heated for ten seconds at 300° C. subsequent to molding (simulating solder reflow conditions employed during mounting of a semiconductor device).

Figure 4:
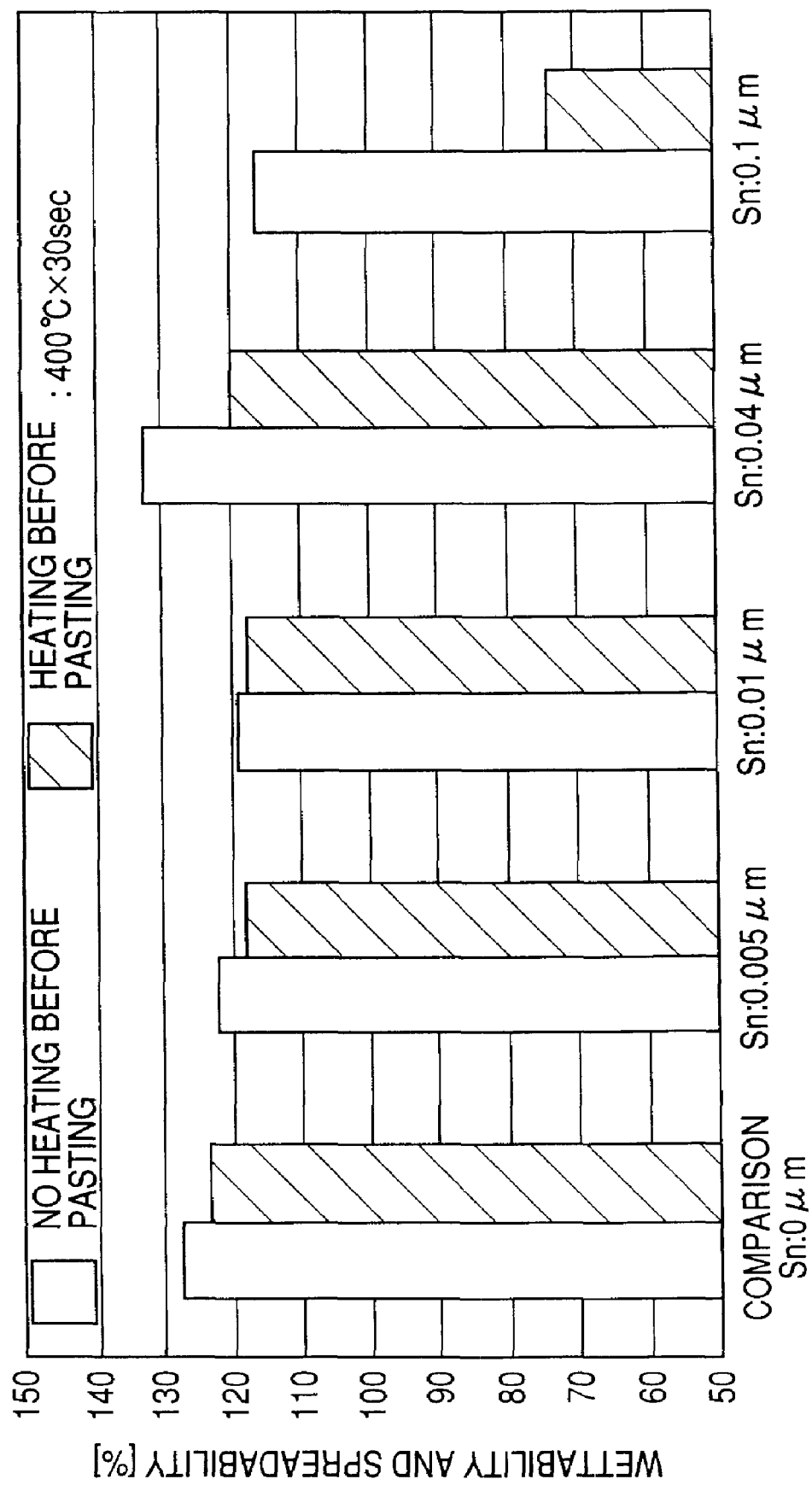
FIG. 4 is a graph showing a result of solder wettability and spreadability test.
Figure 5:
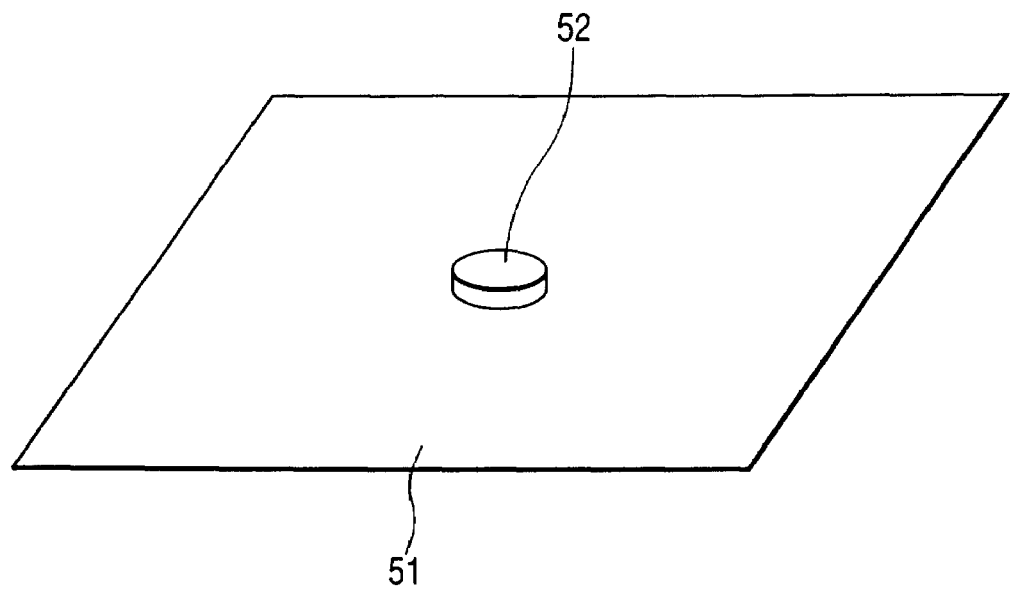
FIG. 5 is a perspective view for describing a sample used in the solder wettability and spreadability test.
Figure 6:
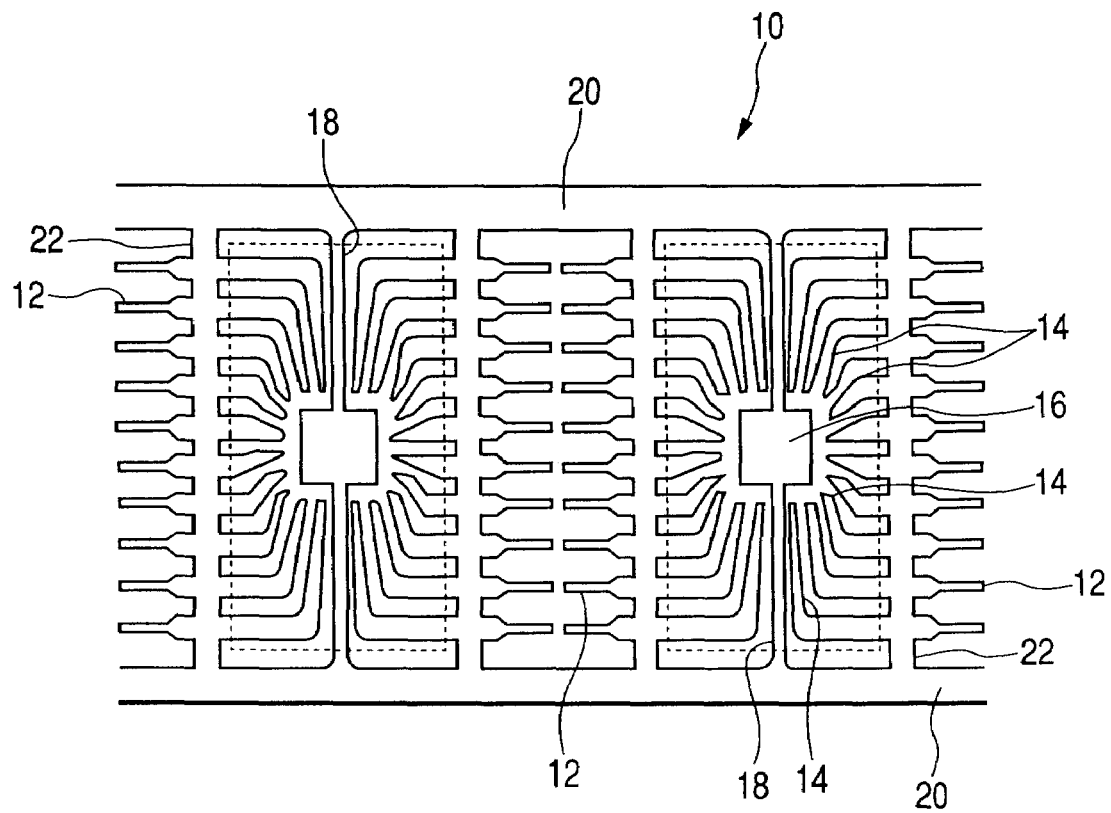
FIG. 6 is a plan view of a related-art leadframe.

FIG. 4 shows results of the test for solder wettability and spreadability on the leadframe. The test for solder wettability and spreadability was carried out through use of the test leadframe sample which is the same as that employed for the previously-described adhesion test. Holes of a metal mask laid on the test leadframe were filled with paste, and the metal mask was removed. As shown in FIG. 5, solder paste 52 was formed and applied on a test leadframe 51 in the form of a pad having a diameter of 1.57 mm and a height of 0.15 mm. The employed solder paste was Sn—Ag—Cu-based solder paste M705-221CM5-42-11 manufactured by Senju Metal Industry Co., Ltd. The thus-applied solder paste was heated for one minute at 230° C. to thus reflow. The diameter of the reflow in an arbitrary direction was measured. An average of five sets of data was determined. Solder wettability and spreadability was computed as a ratio of a diameter achieved before reflow to a mean radius achieved after reflow. Similar tests were conducted through use of the test leadframe sample heated for 30 seconds at 400° C. before application of paste. In the sample, where the Sn layer sandwiched between the Pd layer and the Au layer has a thickness of 0.1 μm, the diameter was reduced when the leadframe was coated with a paste after having been heated at 400° C., and deterioration of solder wettability and spreadability was exhibited.

From these results, the desirable thickness of the Sn layer is found to preferably range from 0.001 to 0.05 μm.

Noble metal (Au, Pd, Ag) used as an exterior material of a leadframe is known to have poor adhesion with commonly-used epoxy-based sealing resin. Meanwhile, a material, such as Cu or Ni, is known to enhance adhesion to a sealing resin as a result of the surface of the material being oxidized and being bonded to an epoxy-based sealing resin through hydrogen bonding. However, when oxidized metal exists in the surface layer of the leadframe, the solder wettability and spreadability of the leadframe are known to be considerably deteriorated, which in turn cause failures in mounting. Accordingly, in the leadframe which has been available thus far, solder wettability and spreadability is sacrificed when an attempt is made to ensure adhesion. The converse also applies.

In contrast, the reason why the adhesion to the sealing resin is enhanced while the superior solder wettability and spreadability are ensured by the present invention is considered to be as follows. For instance, when the Sn layer is situated below the surface Au layer, portions of Au of the Au layer diffuse to the Sn layer, and portions of Sn of the Sn layer diffuse to the Au layer, because of solid-phase diffusion, by means of heating which is achieved at the solder reflow temperature during mounting. Consequently, Sn as well as Au are also present on the surface of the Au layer that is the top layer. Au on the surface, solder wettability and spreadability are ensured. Meanwhile, Sn appearing on the surface is oxidized in moderation, which contributes to enhancement of adhesion to the sealing resin.

What is claimed is:

1. A leadframe for a semiconductor device having a stage section where a semiconductor chip is to be mounted, an inner lead section connected to the stage section, and an outer lead section connected to the inner lead section, said leadframe having a plurality of layers, comprising:
   a nickel (Ni) layer;
   a palladium (Pd) or palladium alloy layer;
   an amphoteric metal layer, wherein a thickness of said amphoteric metal layer ranges from 0.001 to 0.05 μm so as to provide enhanced adhesion to a sealing resin while ensuring solder wettability and spreadability; and
   a gold (Au) layer, wherein all of the layers are formed on a base material forming the leadframe, in sequence from a surface of the base material.

2. The leadframe for a semiconductor device according to claim 1, wherein said amphoteric metal layer is selected from tin (Sn), tin alloy, zinc (Zn) or zinc alloy.

3. The leadframe for a semiconductor device according to claim 1, wherein the thickness of the Pd or Pd alloy layer ranges from 0.005 to 0.05 μm; and the thickness of the Au layer ranges from 0.001 to 0.1 μm.

4. The leadframe for a semiconductor device according to claim 1, wherein a combination of the amphoteric metal layer and the Au layer is formed on the Pd or Pd alloy layer.

5. The leadframe for a semiconductor device according to claim 1, wherein plural sets of a combination of the amphoteric metal layer and the Au layer are formed on the Pd or Pd alloy layer.

6. The leadframe for a semiconductor device according to claim 1, wherein said plurality of layers are formed over the entire surface of the base material forming the leadframe.

7. The leadframe for a semiconductor device according to claim 1, wherein said plurality of layers are formed on a part of the base material forming the leadframe.

8. The leadframe for a semiconductor device according to claim 7, wherein said plurality of layers are formed at least on the outer lead section of the leadframe.

9. A leadframe for a semiconductor device having a stage section where a semiconductor chip is to be mounted, an inner lead section connected to the stage section, and an outer lead section connected to the inner lead section, said leadframe having a plurality of layers, comprising:
   a nickel (Ni) layer;
   a palladium (Pd) or palladium alloy layer; and
   plural sets of a combination of an amphoteric metal layer and a gold (Au) layer, wherein all of the layers are formed on a base material forming the leadframe, in sequence from a surface of the base material.

10. The leadframe for a semiconductor device according to claim 9, wherein said amphoteric metal layer is selected from tin (Sn), tin alloy, zinc (Zn), or zinc alloy.

11. The leadframe for a semiconductor device according to claim 9, wherein the thickness of the Pd or Pd alloy layer ranges from 0.005 to 0.05 μm and the total thickness of the amphoteric metal layers range from 0.001 to 0.05 μm.

12. The leadframe for a semiconductor device according to claim 9, wherein said plurality of layers are formed over the entire surface of the base material forming the leadframe.

13. The leadframe for a semiconductor device according to claim 9, wherein said plurality of layers are formed on a part of the base material forming the leadframe.

14. The leadframe for a semiconductor device according to claim 13, wherein said plurality of layers are formed at least on the outer lead section of the leadframe.

15. A leadframe for a semiconductor device having a stage section where a semiconductor chip is to be mounted, an inner lead section connected to the stage section, and an outer lead section connected to the inner lead section, said leadframe having a plurality of layers, comprising:

a nickel (Ni) layer;

a palladium (Pd) or palladium alloy layer, having a thickness ranging from 0.005 to 0.05 µm;

an amphoteric metal layer, having a thickness ranging from 0.001 to 0.05 µm; and a gold (Au) layer, having a thickness ranging from 0.001 to 0.1 µm, wherein all of the layers are formed on a base material forming the leadframe, in sequence from a surface of the base material.

* * * * *